(12) United States Patent
Ozawa (10) Patent No.: US 7,436,968 B2
(45) Date of Patent: Oct. 14, 2008

(54) ADAPTIVE NOISE REDUCTION METHOD AND DEVICE

(75) Inventor: Kazuhiko Ozawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 381 days.

(21) Appl. No.: 10/523,638

(22) PCT Filed: Aug. 1, 2003

(86) PCT No.: PCT/JP03/09826

§ 371 (c)(1),
(2), (4) Date: Oct. 3, 2005

(87) PCT Pub. No.: WO2004/015709

PCT Pub. Date: Feb. 19, 2004

(65) Prior Publication Data

US 2006/0115096 A1    Jun. 1, 2006

(30) Foreign Application Priority Data

Aug. 7, 2002  (JP) ............... 2002-230368

(51) Int. Cl.
*A61F 11/06*  (2006.01)
*G10K 11/16*  (2006.01)
*H03B 29/00*  (2006.01)

(52) U.S. Cl. .............. 381/71.11; 381/71.9; 381/94.4; 708/322

(58) Field of Classification Search ......... 381/71.11, 381/71.8, 71.9, 94.4, 94.7, 71.2, 71.1, 94.1, 381/94.2, 94.3; 708/300, 322

See application file for complete search history.

(56) References Cited

U.S. PATENT DOCUMENTS 5,426,704 A *  6/1995  Tamamura et al. ......... 381/71.9
5,602,927 A *  2/1997  Tamamura et al. ......... 381/71.4
5,708,637 A *  1/1998  Umemura et al. ......... 369/47.34
6,633,894 B1 * 10/2003  Cole ........................ 708/300

FOREIGN PATENT DOCUMENTS

| JP | 61-288613 | 12/1986 |
|---|---|---|
| JP | 3-277009 | 12/1991 |
| JP | 5-40485 | 2/1993 |
| JP | 5-127679 | 5/1993 |
| JP | 6-35487 | 2/1994 |
| JP | 7-199962 | 8/1995 |
| JP | 11-176113 | 7/1999 |
| JP | 11-232802 | 8/1999 |
| JP | 11-232803 | 8/1999 |

OTHER PUBLICATIONS

Microfilm of the specification and drawings annexed to the request of Japanese Utility Model Application No. 11315/1990 (Laid-open No. 103626/1991) Oct. 28, 1991.

* cited by examiner

*Primary Examiner*—Vivian Chin
*Assistant Examiner*—Jason Kurr
(74) *Attorney, Agent, or Firm*—Frommer Lawrence & Haug, LLP; William S. Frommer; Ellen Marcie Emas (57) ABSTRACT

An adaptive noise reduction method and apparatus capable of reducing efficiently variable period noise from a main input is provided. The pitch of a noise waveform to be reduced can be variable with a change in a period of motor noise occurring when the revolution period is changed by disc motor control of DVD-RAM, by revolution speed control of other motors, and revolution period change on starting a motor and the like. Therefore, the renewal of adaptive filter coefficient becomes almost unnecessary, thus allowing noise reduction to be performed without degrading a noise canceling effect.

17 Claims, 7 Drawing Sheets

FIG. 3A  Fixed Output

FIG. 3B  Variable Output

FIG. 10A    PRIOR ART    Write Signal

FIG. 10B    PRIOR ART    Read Signal

ADAPTIVE NOISE REDUCTION METHOD AND DEVICE

TECHNICAL FIELD

The present invention relates to an adaptive noise reduction method and apparatus capable of performing a satisfactory adaptive noise reduction even against a variable period noise in which, for example, the period of a target noise varies, and particularly relates to an adaptive noise reduction method and apparatus suitably applied to reduce, for example, an electromagnetic noise, noise, a vibration noise and the like which originate from a disc motor for driving to revolve a digital versatile disc-random access memory (hereinafter abbreviated to DVD-RAM).

BACKGROUND ART

For example, a synchronous type adaptive filter which cancels from a main input a periodic noise originating from a revolving drum motor of a camera-integrated type video tape recorder (hereinafter abbreviated to VTR) is proposed in Patent Gazette of Japanese Published Patent Application No. H11-176113 and so on. In the adaptive filter employed in a technology disclosed in this gazette, the noise is reduced by renewing and converging filter coefficients adaptively to the target noise occurring at a constant period (for example, 150 Hz) along with the above-described motor revolutions.

Figure 6:
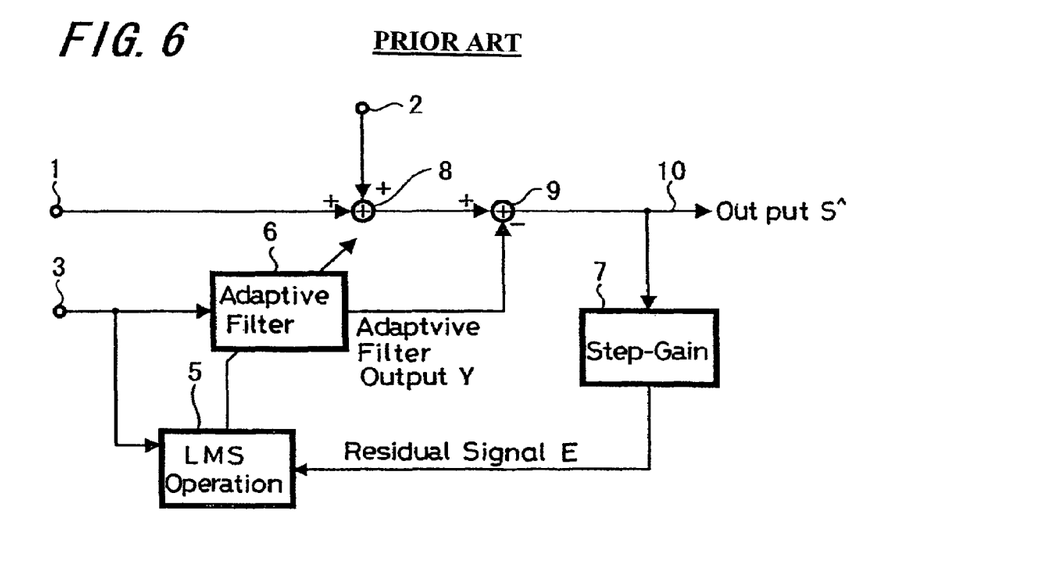
FIG. 6 is a block diagram of a conventional adaptive noise reduction circuit.

FIG. 6 shows a block diagram of a conventional adaptive noise reduction circuit, an outline of which will be described. In FIG. 6, an input terminal 1 receives a main audio input S whose noise is to be reduced. In actual equipment, for example, noise N schematically shown is supplied to an input terminal 2 and is simply added to the main audio input S at an adder 8, which causes the main audio input S to be mixed with the noise N. The adaptive noise reduction method reduces the noise N from the main audio input S mixed with the noise N, and therefore, the main audio input S mixed with the noise N is supplied to a (+) side terminal of an adder 9.

On the other hand, a reference input X highly correlated with the noise N is supplied to an input terminal 3. The reference input X is supplied to an adaptive filter 6, where an adaptive filter output Y that is approximate to the noise N is formed by adaptation processing. Then, an adaptive filter output Y thus formed is supplied to a (−) side terminal of the adder 9 and is subtracted there from the main audio input S mixed with the noise N. Accordingly, an audio output Ŝ is derived from the adder 9, from which the noise N is removed by the adaptive filter output Y as is shown by the following expression (0).

$$\hat{S} = S + N - Y \qquad \text{expression (0)}$$

This audio output Ŝ is an audio signal of originally aimed, from which the noise N is removed and is output to an output terminal 10. Simultaneously, the audio output Ŝ (a residual signal E) is fed back through a step gain 7 to be used in adaptation processing. Specifically, the residual signal E is supplied to, for example, a least mean square (hereinafter abbreviated to LMS) operation processing circuit 5 together with the reference input X, where an operation of coefficients of the adaptive filter 6 is performed so that, for example, noise power of the residual signal E may become minimum.

Further, the above-described adaptive filter 6 will be described below in detail with reference to a block diagram of FIG. 7. Note that, while various methods have been proposed for algorithm of the adaptive filter, the above-described LMS method is often employed because its convergence speed is comparatively fast and a scale of operational circuit is small in general. Moreover, those circuits can be processed with hardware whose circuit is all made up of digital signal processor (hereinafter abbreviated to DPS), digital large scale integrated circuit (hereinafter abbreviated to digital LSI) and the like, or software using microcomputer.

Figure 7:
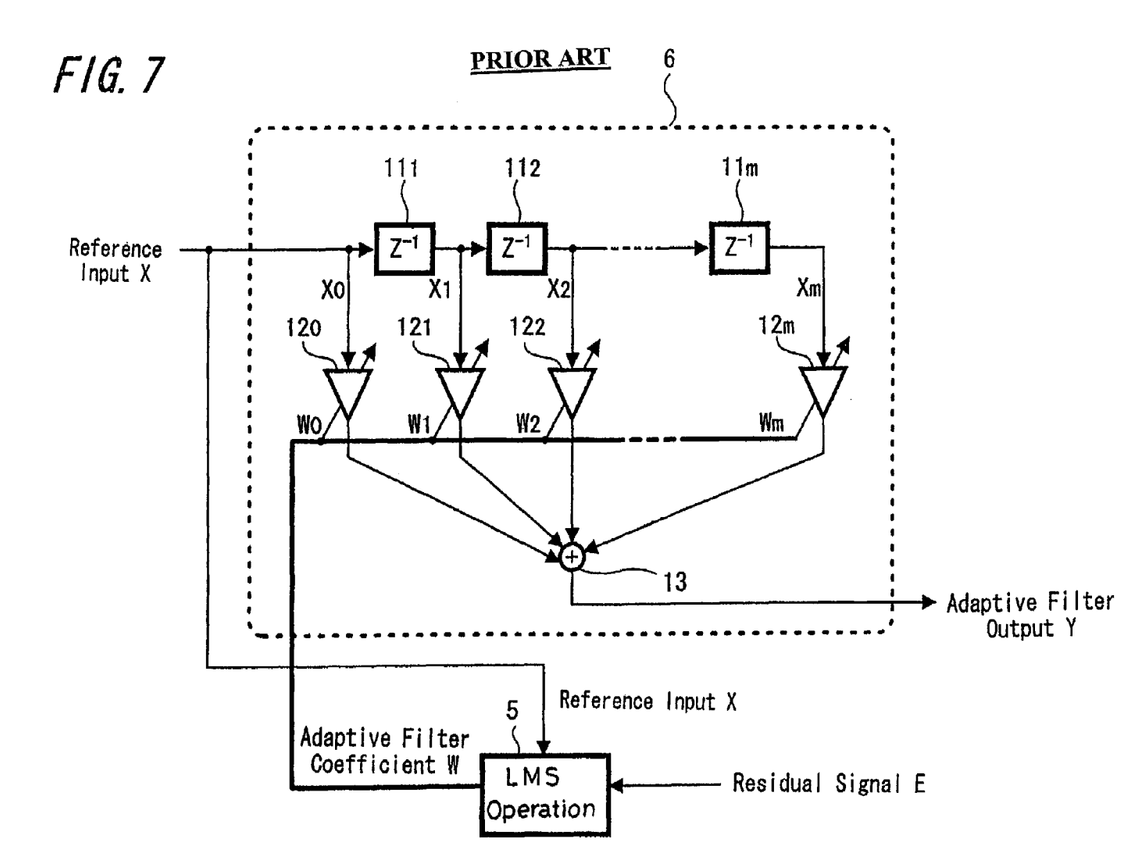
FIG. 7 is a block diagram of a conventional adaptive filter.

Hereupon, in FIG. 7, the reference input X is supplied to the adaptive filter 6 surrounded by a broken line as well as the LMS operation processor circuit 5. The adaptive filter 6 is conventionally includes a FIR digital filter which has about several hundred taps, and the filter coefficient W in each of the taps is adaptively renewed in accordance with, for example, the LMS algorithm. In FIG. 7, the FIR filter having (m+1) taps is shown, which is provided with unit delay means $11_1$ to $11_m$ each having a delay $Z^{-1}$ of unit sampling time.

Therefore, delayed signals $X_0$ to $X_m$ are obtained from these unit delay means $11_1$ to $11_m$, respectively. These signals $X_0$ to $X_m$ are supplied to multipliers $12_0$ to $12_m$ for multiplying them by coefficients. Moreover, to these multipliers $12_0$ to $12_m$ are supplied the adaptive filter coefficients $W_0$ to $W_m$ formed in, for example, the LMS operation processing circuit 5. All outputs of these multipliers $12_0$ to $12_m$ are added in an adder 13 to be output as the adaptive filter output Y.

The adaptive filter output Y is represented by the following expression (1).

$$Y = \sum_{j=0}^{m} (Wj \cdot Xj) \qquad \text{expression (1)}$$

Further, in the LMS operation processing each of adaptive filter coefficients $W_0$ to $W_m$ is renewed in accordance with the following expression (2) from the above-described reference input X and residual signal E.

$$Wk+1 = Wk + 2\mu \cdot Ek \cdot Xk \qquad \text{expression (2)}$$

In this expression (2), the small letter k represents passing time, as an example, assuming that a value k is renewed by every unit sampling, the value k indicates the $k^{th}$ sampling and a value (k+1) indicates the $(k+1)^{th}$ sampling.

The value μ is a coefficient given by the step gain 7. The value μ is called a step gain or step size which is a parameter that determines a convergence speed in the LMS algorithm. It is noted that if the value μ is large, the convergence becomes fast, however accuracy after convergence falls; inversely, if the value μ is small, the convergence becomes slow, however accuracy after convergence rises. For this reason, the value μ is set at an optimum according to an adaptive system condition in use and the like.

In this way, according to the above-described apparatus, in the LMS operation processing the adaptive filter coefficient W in the adaptive filter is renewed according to the expression (2) such that the signal highly correlated with the reference input X and included in the residual signal E is kept to a minimum, so that a component of noise N contained in the main audio input S can be kept to a minimum by inputting to the reference input X the above signal correlated with noise N. In other words, between the LMS operation processor circuit 5 and adaptive filter 6, such a feedback loop that makes minimum of a component of the residual signal E is formed.

A conventional fixed-period noise reduction block will further be described with reference to FIG. 8. In the following description, elements of the same function as in FIG. 6 are denoted by the same reference numerals.

First, similarly to FIG. 6, the main audio input S whose noise is to be reduced is supplied to an input terminal 1. In actual equipment, for example, noise N is schematically supplied to the input terminal 2 and is added simply to the main audio input S in the adder 8 to make the main audio input S mixed with noise N. A pseudo-noise signal Yk is supplied to a (−) side terminal of the adder 9 from an adaptive signal processor 20 surrounded by a broken line, and by subtracting the pseudo-noise signal Yk, only the main audio input S is obtained at the output terminal 10.

At the same time, the above-described error signal through the step gain 7 is supplied to the adaptive signal processor 20. Further, the fixed-period pulse signal as the reference input signal from an input terminal 3 and a sampling clock from an input terminal 21 are supplied to the adaptive signal processor 20. Hereupon, the adaptive signal processor 20 includes the same adaptive filter as in FIG. 7, which renews the coefficients in accordance with the LMS algorithm, and processing thereof is performed in synchronism with the sampling clock from the input terminal 21.

In addition, the sampling clock corresponds with a sampling frequency of the main audio input S and noise N. In FIG. 8, the sampling clock from the input terminal 21 and the fixed-period pulse signal from the input terminal 3 are inputted to a counter 22 within the adaptive signal processor 20, and a period of the input is counted by the sampling clock and the counted value thereof is supplied to a timing generator 24 to generate a predetermined timing pulse.

Then, from the timing pulse, an Xk address is generated in turn from 0 to m in a read-address generator 23 and Xk−1 address is generated in turn from 0 to m in a write-address generator 25. These Xk addresses and Xk−1 addresses are respectively input as the read address and write address to an accumulator 26 composed of static RAM (hereinafter abbreviated to SRAM) or the like.

Further, the accumulator 26 has registers of, for example, m+1 words (m+1 taps) at the maximum, each of which has a predetermined bit length. Then, the accumulator 26 of m+1 taps is designed that an adaptive coefficient W is read from or written into the respective specified addresses with the predetermined timing within one period, according to the read address Xk or the write address Xk−1.

Furthermore, to one terminal of an adder 28 is supplied 2 μEk which is obtained by multiplying the above-described error signal Ek by the step-gain p, and to the other terminal of the adder 28 is supplied data Wk read from the address Xk of accumulator 26. An output of the adder 28 obtained by adding both the inputs is then delayed by a unit sampling time 27, and the resulted signal is written into the Xk−1 address of the accumulator 26. Likewise, the pseudo-noise signal Yk of one period before is read from the Xk address.

Figure 8:
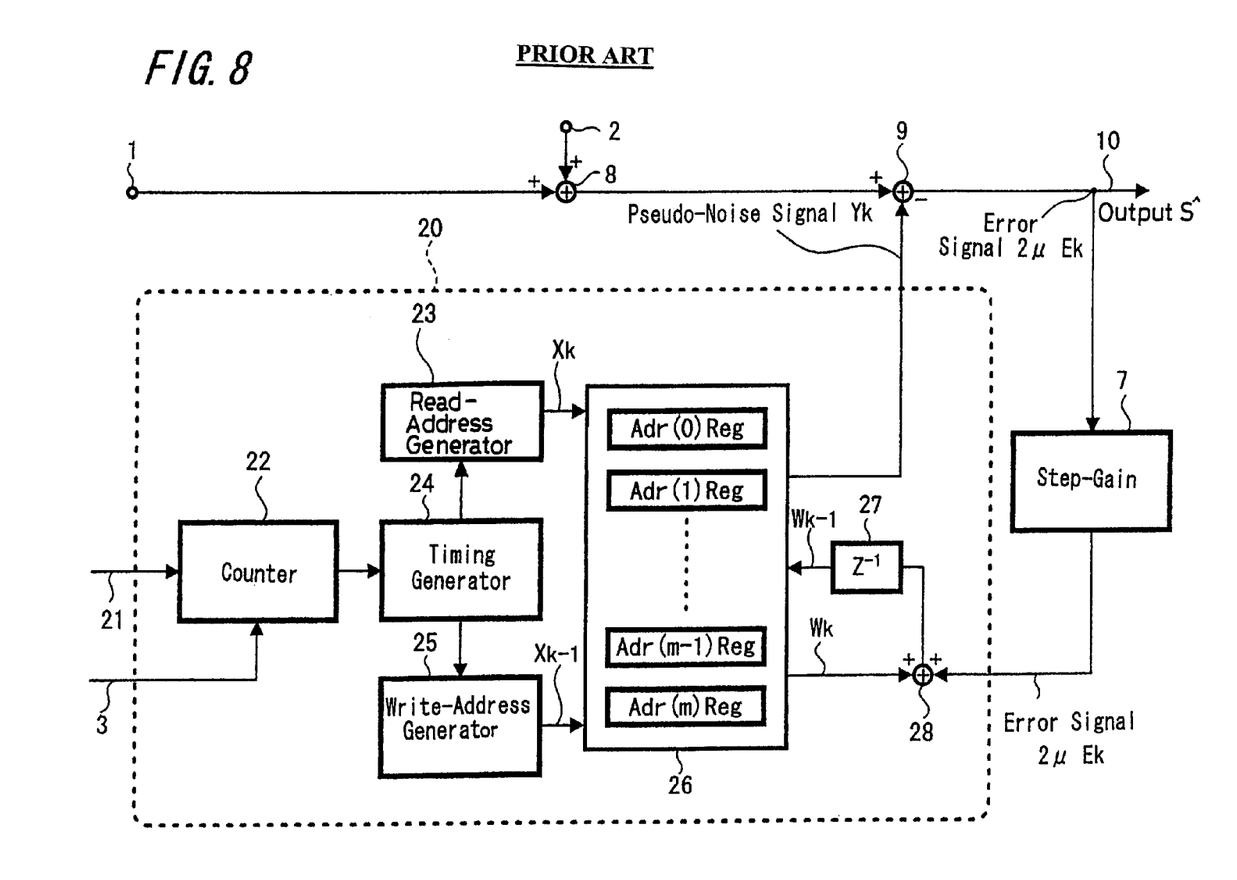
FIG. 8 is a block diagram showing the configuration of a fixed-period noise reduction processor block according to a conventional adaptive noise reduction method.

Accordingly, in FIG. 8, the adaptive filter coefficient W is renewed using the above-described expression (1) such that the noise component which is contained in the error signal E and is highly correlated with the drum reference signal X may always become minimum, and a main signal output whose noise is always reduced is obtained at the output terminal 10.

Figure 9:
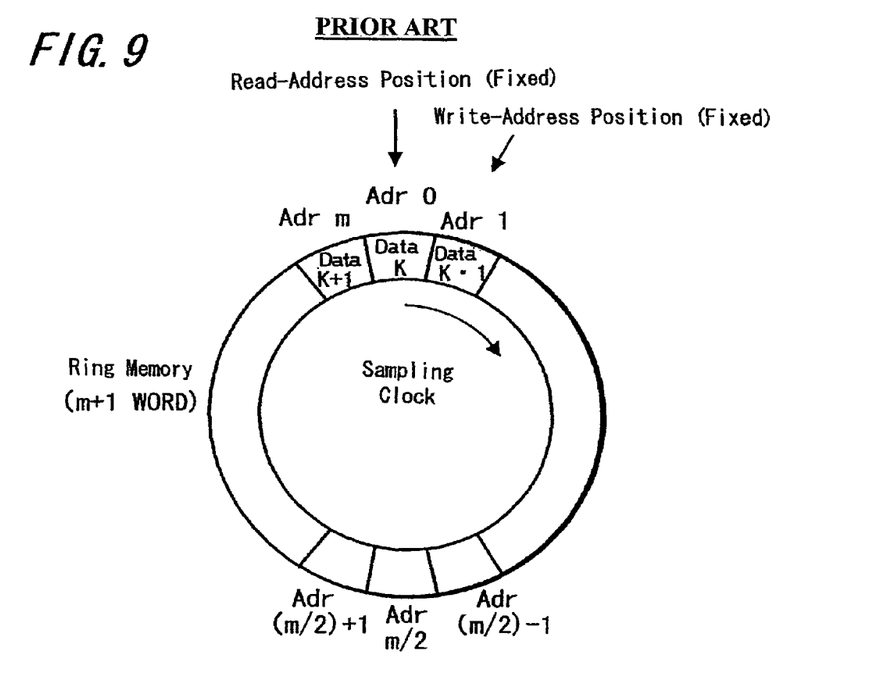
FIG. 9 is a diagram for explaining the operation thereof.

Next, an example of addressing by the fixed-period adaptive filter shown in FIG. 8 will be described with reference to FIG. 9. In this case, 0 to m words of the accumulator 26 in FIG. 8 is first formed in the shape of a ring. In other words, an address next to Adr:m is made to be Adr:0, or an address preceding to Adr:0 is made to be Adr:m. Assuming that a time of one period is T[s] and a sampling frequency is S[Hz] with respect to the number of sampling clock within one fixed period, the value m has the following relation.

$$m \approx S \cdot T \qquad \text{expression (3)}$$

Figure 10A:
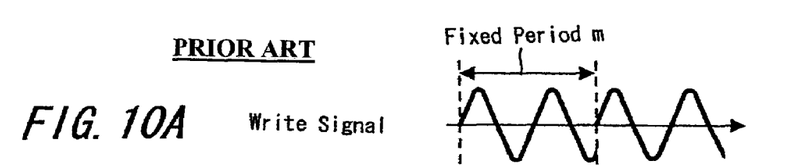
FIGS. 10A and 10B are waveform diagrams for the explanation thereof.
Figure 10B:
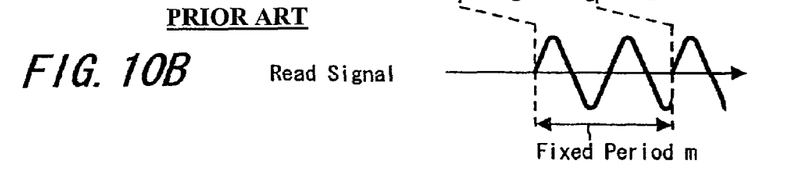

Then, the write-address generator 25 controls data within the ring-shaped memory to move in the direction shown with an arrow by one address at every sampling clock, and to fix relatively a read-address position and a write-address position at positions shown in the figure. Accordingly, a write signal as shown in FIG. 10A, for example, and a read signal delayed by a predetermined amount as shown in FIG. 10B are obtained. A pitch of both the signals is definite and becomes a fixed period m.

Specifically, according to the above-described apparatus, the noise can be reduced by renewing and converging the filter coefficients adaptively to target noise occurring at a constant period (for example, 150 Hz) as a rotary drum motor of, for example, a camera-integrated VTR revolves.

However, in case of the variable period noise in which a period of, for example, target noise varies, it is necessary to renew the number of taps and coefficients of the above-described adaptive filter in accordance with the periodic variation. Specifically, with respect to the target noise occurring at a definite period, the noise is reduced with such adaptive filter that has, for example, as many taps as a quotient got when that period divided by the sampling period, whereas if the period varies, the number of taps must be changed. Moreover, when the period varies, it is assumed that a waveform of the target noise will also change.

To cope with this problem, it is conceived that the adaptive filter coefficients must be renewed corresponding to the periodic variation. In general, however, because the step-size (or step-gain) that is a parameter determining a time required for renewal of the filter coefficient is determined taking into account the influence from external disturbance and the like, it is impossible to increase the step-size (or step-gain) corresponding to the periodic variation. For this reason, there is a possibility that, when the period varies fast for example, there may happen a case where the adaptive filter cannot follow, thus making the noise reduction impossible disadvantageously.

Additionally, an example of the variable period noise is an electromagnetic noise, noise, and a vibration noise originating from the disc motor in DVD-RAM. In this case, the disc motor adopts a zoned constant linear velocity (hereinafter abbreviated to ZCLV) system for a revolution control system. This system divides a recording area into zones according to a radial position of the disc and sets the number of revolution of disc such that a recording density in each zone may become almost constant, thus causing the number of revolution to vary in each zone.

In this example, the number of revolution varies in the range of, for example, 3246 (at inner circumference) rpm to 1375 (at outer circumference) rpm. Thus, during the movement between zones at seek time for example, the number of revolution must be changed rapidly, which causes the above-described variable period noise to occur depending on a change in the number of revolution. In addition, even though the revolution control system is the conventional CLV system, the number of revolution is rapidly varied at the seek time or the like, so the variable period noise will occur depending on a change in the number of revolution.

This application has been made in view of those points and aims to solve a problem in which, with the conventional adaptive noise reduction method and apparatus, it is difficult to make the adaptive filter coefficients rapidly follow the variable period noise whose period changes rapidly, thus making it impossible to reduce efficiently the variable period noise from the main input.

DISCLOSURE OF INVENTION

A first aspect of the present invention is an adaptive noise reduction method including an adaptive filter for obtaining a signal approximate to a periodic signal to be reduced from a reference input pulse signal in synchronism with the periodic signal to be reduced within a main input signal, and a composition means for subtracting the adaptive filter output signal from the main input signal, in which an output signal of the composition means is fed back to the adaptive filter, and the adaptive filter performs adaptation processing so that noise power of the output signal of the composition means may become minimum; the adaptive noise reduction method is provided with a ring-shaped memory constituting the adaptive filter, a read-address generator for generating read addresses of the ring-shaped memory, and a write-address generator for generating write addresses thereof, and to make a relative phase between the read address and write address variable.

Accordingly, the pitch of a noise waveform to be subtracted can be variable following the periodic change of a motor noise occurring when a revolution period changes at the time of disc motor control in DVD-RAM and of revolution speed control in other motors, or at the time of starting motor or the like, so that the renewal of adaptive filter coefficients becomes almost unnecessary and the noise reduction can be performed without degrading the noise canceling effect.

According to a second aspect of the present invention, the relative phase between the read address and write address varies corresponding to the periodic change of the reference input pulse signal, so that the adaptive filter is formed of the ring-shaped memory and the pitch of a noise waveform to be reduced can be varied with ease by making the relative phase between the read address and write address vary. Thus, comparing with the conventional processing of fixed-period type noise reduction, it is possible to reduce an increase of circuits.

According to a third aspect of the present invention, the output signal of the adaptive filter is subtracted by composition means from the main input signal through data interpolation means, so that pitch-conversion accuracy can be improved for calculating data by interpolation processing, corresponding with relative phase position between the write address and read address.

According to a fourth aspect of the present invention, the number of taps (the number of words) M of the ring-shaped memory constituting the adaptive filter has a relation of M≧S•TM, where S is a sampling frequency of the periodic signal to be reduced and TM is the maximum period which the reference input pulse signal can take, so that by always storing in memory the adaptive coefficients having the extent of one period of the maximum period, even in case of a short period, it is possible to cope with only by changing the address position and to cause almost no renewal of adaptive coefficients.

A fifth aspect of the present invention is an adaptive noise reduction apparatus including an adaptive filter for obtaining a signal approximate to a periodic signal to be reduced from a reference input pulse signal synchronous with the periodic signal to be reduced within a main input signal, and a composition means for subtracting an output signal of the adaptive filter from the main input signal, in which an output signal of the composition means is fed back to the adaptive filter that performs adaptation processing so that noise power of the output signal of the composition means may become minimum; and the apparatus further includes a ring-shaped memory constituting the adaptive filter, a read-address generator for generating read addresses of the ring-shaped memory, and a write-address generator for generating write addresses thereof, in which relative phase between the read address and write address are made variable.

According to a sixth aspect of the present invention, the relative phase between the read address and write address varies corresponding to the periodic change of the reference input pulse signal, so that the adaptive filter is formed of the ring-shaped memory and the pitch of a noise waveform to be reduced can be varied with ease by making relative phase between the read address and write address vary. Thus, compared with the conventional processing of fixed-period type noise reduction, it is possible to reduce an increase of circuits.

According to a seventh aspect of the present invention, the output signal of the adaptive filter is subtracted by composition means from the main input signal through data interpolation means, so that pitch-conversion accuracy can be improved for calculating data by interpolation processing, corresponding with relative phase position between the write address and read address.

According to an eighth aspect of the present invention, the number of taps (the number of words) M of the ring-shaped memory constituting the adaptive filter has a relation of M≧S•TM, where S is a sampling frequency of the periodic signal to be reduced and TM is the maximum period which the reference input pulse signal can take, so that by always storing in memory the adaptive coefficients having the extent of one period of the maximum period, even in case of a short period, it is possible to cope with only changing the address position and to cause almost no renewal of adaptive coefficients.

BEST MODE FOR CARRYING OUT THE INVENTION

In the present invention, the adaptive filter is formed of a ring-shaped memory and a relative phase between the read address and write address of the ring-shaped memory can arbitrarily be varied, and therefore a variable pitch adaptive noise reduction method and apparatus capable of reducing from the main input efficiently the variable period noise in which it is difficult to make the adaptive filter coefficients follow.

Figure 1:
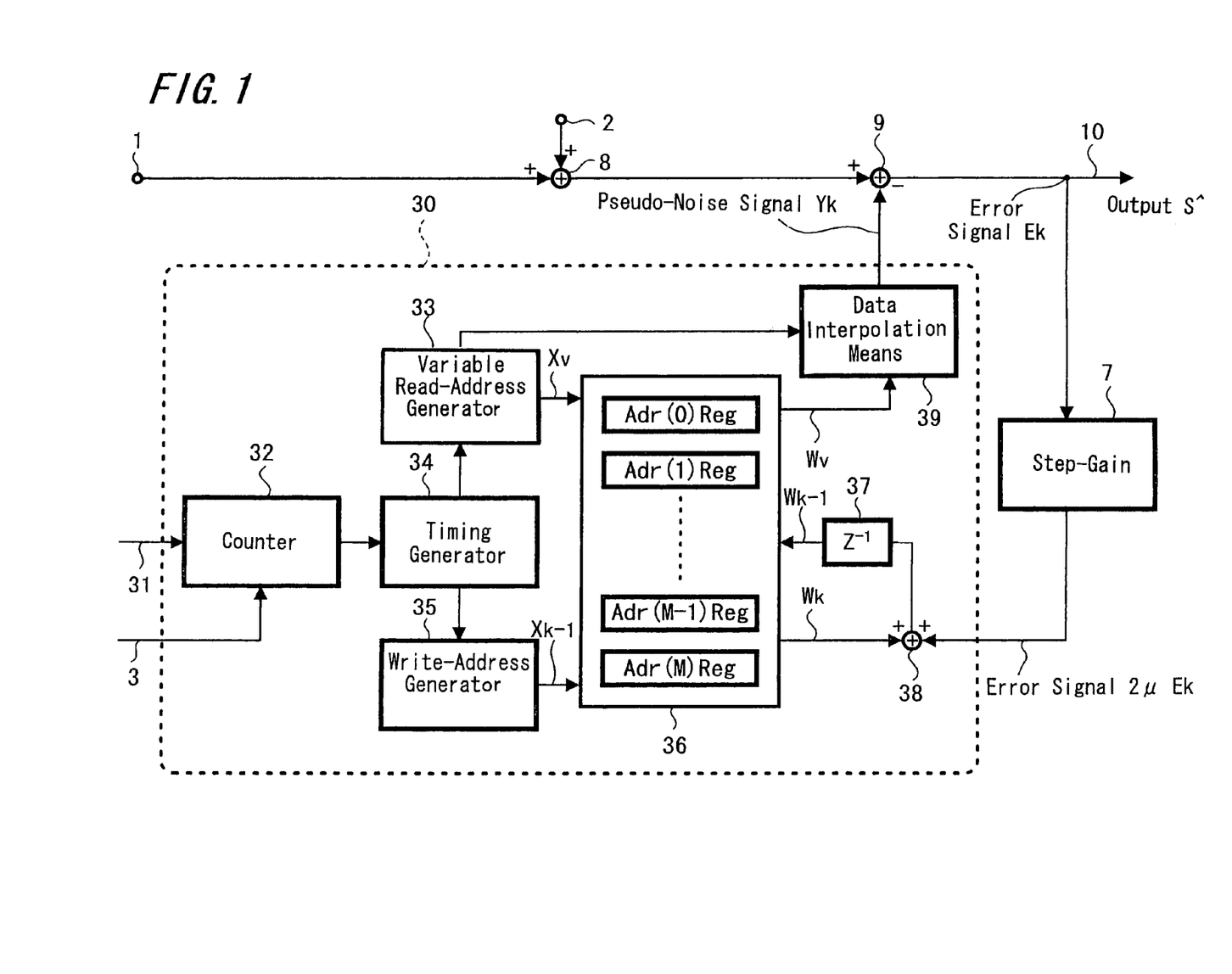
FIG. 1 is a block diagram showing the configuration of an embodiment of a variable period noise reduction processor block, to which the adaptive noise reduction method and apparatus according to the present invention is applied.

The present invention will be described below with reference to accompanying drawings. FIG. 1 is a block diagram showing the configuration of a variable period noise reduction processor block as an embodiment to which the adaptive noise reduction method and apparatus according to the present invention is applied. In the following description, blocks having the same function as those in FIG. 8 are denoted by the same reference numerals to dispense with the explanation.

First, similarly to FIG. 8, the main audio input S whose noise is to be reduced is supplied to an input terminal 1. In actual equipment, the main audio input S is mixed with noise. Thus, by way of example, noise N is schematically supplied to an input terminal 2 and is simply added to the main audio input S by an adder 8. A pseudo-noise signal Yk is supplied to a (−) side terminal of an adder 9 from an adaptive signal processor 30 surrounded by a broken line, and then by subtracting this pseudo-noise signal Yk, only the main audio input S is obtained at an output terminal 10.

At the same time, an error signal is supplied to the adaptive signal processor 30 through the above-described step-gain 7. Further, a variable period pulse signal as the reference input signal from an input terminal 3 and a sampling clock from an input terminal 31 are supplied to the adaptive signal processor 30. The adaptive signal processor 30 is hereupon includes the adaptive filter performing the coefficient renewal using the same LMS algorithm as described above referring to FIG. 7, and processing thereof is performed in synchronism with the sampling clock from the input terminal 31.

The sampling clock corresponds with a sampling frequency of the main audio input S and noise N. In FIG. 1, the sampling clock from the input terminal 31 and the variable period pulse signal from the input terminal 3 are supplied to a counter 32 within the adaptive signal processor 30, where input periods are counted one after another by the sampling clock, and the counted value is supplied to a timing generator 34 to generate the predetermined timing pulse.

From the timing pulse, a variable read-address generator 33 generates in turn Xv addresses 0 to M and a write-address generator 35 generates in turn Xk−1 addresses 0 to M. Further, those Xv addresses and Xk−1 addresses are supplied to an accumulator 36 including SRAM and so on as the read addresses and write addresses, respectively.

The accumulator 36 includes registers having a predetermined bit length of, for example, M+1 words (M+1 taps) at the maximum. The accumulator 36 of M+1 taps is designed that adaptive coefficients W are read from and written into the respective specified addresses of the read addresses Xv or write addresses Xk−1 with the predetermined timing within one period.

To one terminal of an adder 38 is supplied 2 μEk, the product of the above-described error signal Ek multiplied by the step-gain μ and to the other terminal of the adder 38 is supplied data Wk read from the address Xk of accumulator 36. An output signal of the adder 38, that is, the sum of both the above signals is delayed by a unit sampling time 37 and is written into the above-described Xk−1 address of accumulator 36.

Moreover, the adaptive coefficient Wv is read from the Xv address generated in the above-described variable read-address generator 33 and the thus read adaptive coefficient Wv is supplied to a data interpolation means 39. This data interpolation means 39 generates the optimum data with respect to an address position generated by the variable read-address generator 33 by, for example, linear interpolation. An output signal of the data interpolation means 39 is supplied to a (−) side terminal of an adder 9 as the pseudo-noise signal Yk from the adaptive signal processor 30.

Thus, in FIG. 1, the adaptive filter coefficients W are renewed using the above-described expression (1) such that noise component highly correlated with the variable period pulse signal supplied from the input terminal 3 as the reference input signal may be minimum, and as a result, a main signal output from which the noise component is reduced is obtained at the output terminal 10.

Next, an addressing example of the variable period adaptive filter in FIG. 1 will be described with reference to FIG. 2. In this example, also words 0 to M of the accumulator 36 in FIG. 1 are formed first in the shape of a ring. In other words, the next address to Adr:M is made to be Adr:0, or the preceding address to Adr:0 is made to be Adr:M. This value M has the following relation of $$M \geq S \cdot TM \qquad \text{expression (4)}$$

where TM[s] is the maximum period time among the variable period and S[Hz] is a sampling frequency.

On this occasion, the write-address generator 35 in FIG. 1 performs control to move data within the ring-shaped memory in the direction of arrow by one address at every one sampling clock. By changing a read-address position relative to a write-address position, the pitch can be changed. Specifically, when changing the read-address position in the direction of arrow that is a reverse direction to the data-moving direction, the pitch rises and when changing the read-address in the reverse direction to the arrow that is the same direction as the data-moving direction, the pitch falls.

Figure 3A:
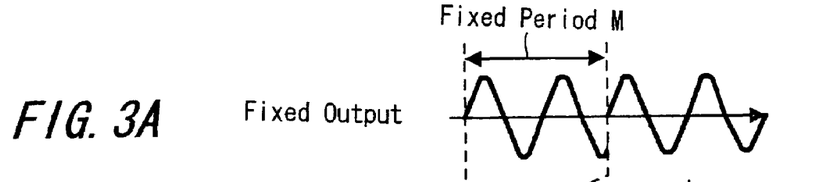
FIGS. 3A and 3B are waveform diagrams for explaining the operation thereof.
Figure 3B:
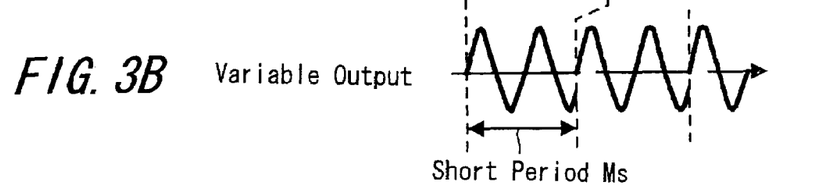

In other words, with respect to a fixed period M, as shown in FIG. 3A, of an output when the read-address position is fixed, in the case where the read-address position is changed, for example, in an arrow direction that is a reverse direction to the data-moving direction, the output will have a short period MS as shown in FIG. 3B. In addition, when in the case where the read-address position is changed in a reverse-to-arrow direction that is the same direction as the data-moving direction, the output will have a long period.

Figure 4A:
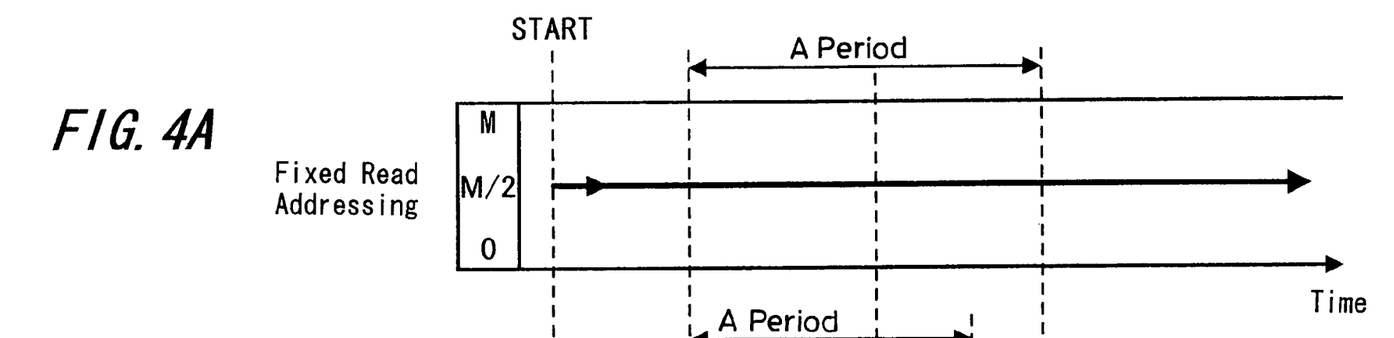
FIGS. 4A to 4C are diagrams for explaining the operation thereof.

Further, the addressing in FIG. 2 will be described in detail with reference to FIGS. 4A to 4c. Hereupon, FIG. 4A shows a case where the read-address position is fixed at, for example, around M/2 with respect to the write-address position, in which a vertical axis represents the address and a horizontal axis represents time. As is shown, the reading is repeated at every predetermined regular period.

Figures 4B, 4C:
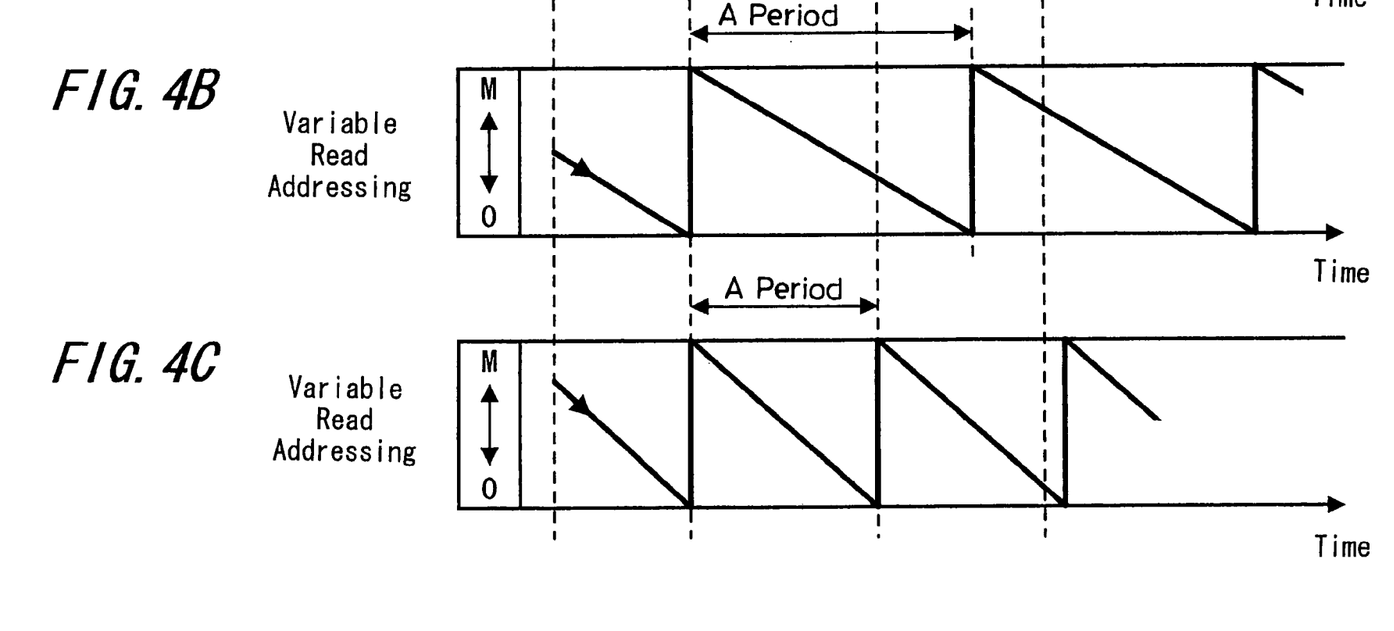

In contrast, FIG. 4B shows a case where the read-address position is made to be variable relative to the write-address position, in which the pitch or speed increases compared with FIG. 4A, and the repeating period becomes shorter. Further, FIG. 4C shows a case where the pitch or speed is increased more than in FIG. 4B, in which the repeating period becomes still shorter.

In this way, according to the present invention, the period can easily be varied by changing a relative inclination of the address to time. Therefore, by changing the relative inclination in accordance with the variable period pulse supplied to the terminal 3 in FIG. 1, an addressing period of the ring-shaped memory can be changed and the followability of the adaptive filter will be greatly improved.

In this context, a supplementary explanation will be given with respect to the data interpolation means 39 in FIG. 1. In the present invention, while the variable read-address generator 33 generates the address in every sampling, in order to maintain linearity of the relative inclination in FIG. 4, an address position at M word of the accumulator 36 does not always become the optimum address position and there will happen cases where the optimum position comes between the addresses. Therefore, the data interpolation means 39 generates data on arbitrary positions between M word addresses by the linear interpolation method and the like.

Figure 2:
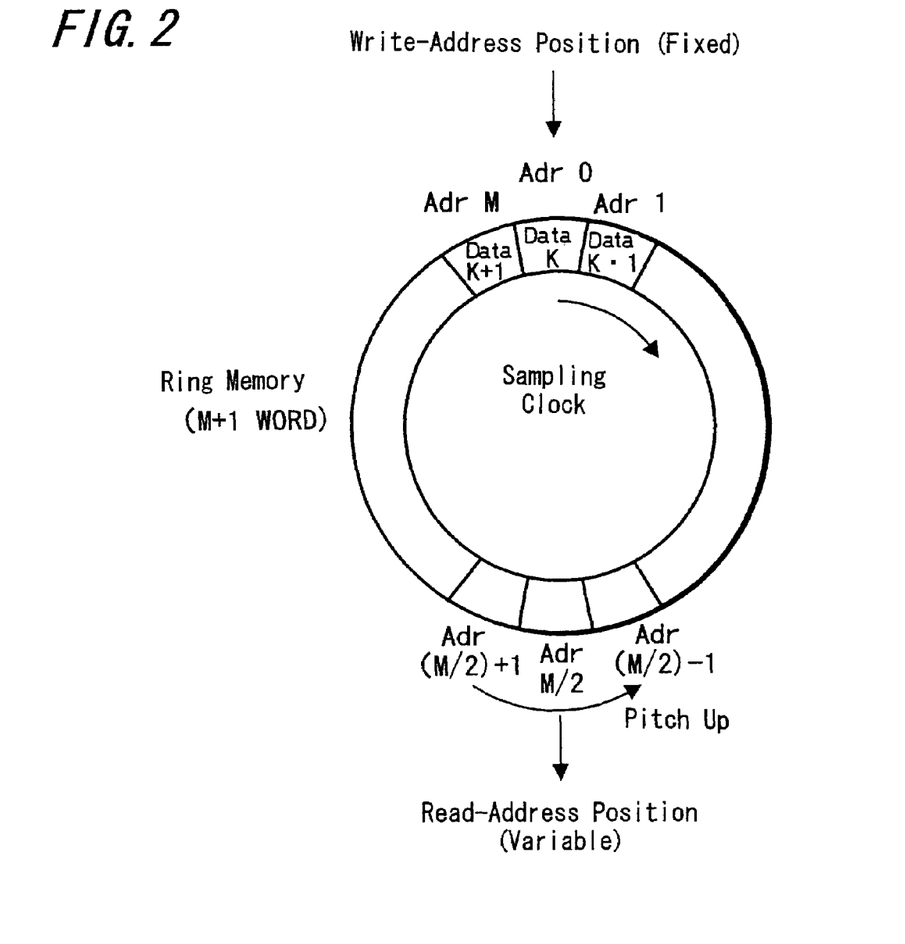
FIG. 2 is a diagram for explaining the operation thereof.

In addition, having described so far that the write address is fixed and the read address is varied referring to FIGS. 2 and 4, because the present invention changes the pitch by changing a relative phase between both addresses, it is allowed that the read address is fixed and the write address is varied or both of the write address and read address are varied.

Moreover, a subtraction means in the above described embodiment is not limited to a subtraction element in circuit and can be replaced with an active noise canceller having a speaker which emits canceling noise into space. The periodic noise emitted into space can also be cancelled.

Furthermore, in the above-described embodiment, the ZCLV control is characterized in that a plurality of zones having a predetermined number of revolution are provided in the radial direction of a disc; when a pickup moves within a zone, the number of revolution of the disc does not change; and only when it moves over between zones, the number of revolution of the disc changes and thus the generated noise pitch changes.

In this connection, there is a difference in the amount of change in noise pitch, for example, when moving between adjacent zones and in the amount of change in noise pitch, for example, when moving over zones in a large stride such as when seeking; and if this amount of change is large, it will take time to settle in the number of revolution of the target zone. This is also true with the disc of a CLV control system. An amount of change in a revolution speed of a disc differs depending on a moving distance of the pickup in the radial direction of a disc from the current position to a target position, and if the amount of change is large, it will take time to settle in a predetermined revolution speed at the target position.

Thus, for example, by installing in a microcomputer (or DSP) for controlling a disc motor (spindle motor) a correlation table of time with the number of revolution as a read only memory (hereinafter abbreviated to ROM) table, and controlling the number of disc revolution and the period of a variable period pulse according to the present invention at the same time based on the ROM table when changing the number of disc revolution, it is possible to change the noise pitch in adaptation processing without delay to the change of the number of disc revolution, and thus the followability of noise reduction is further improved.

Figure 5:
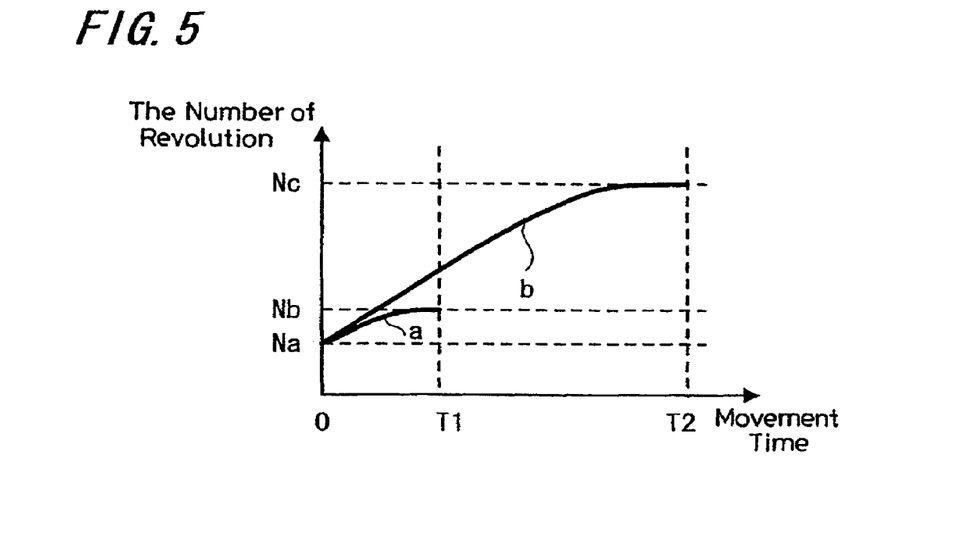
FIG. 5 is a diagram for the explanation thereof.

Specifically, it is assumed first that Na is the predetermined number of revolution at the current position of a pickup, and T1 is a movement time required to settle from Na in the target number of revolution Nb at the adjacent zone along a curve a in FIG. 5. Then, it takes a movement time T2 to settle in the target number of revolution Nc passing through a plurality of zones along a curve b in FIG. 5. In this manner, the larger an amount of change of the number of revolution is, the longer its movement time becomes. As a result, unless the adaptation processing follows without delay to the noise pitch according to a change in the number of revolution, noise will be heard.

Therefore, by obtaining the above-described curve of the movement time and the number of revolution in advance, making it into a table, and reading the data appropriately for use, it is possible to improve the followability of adaptation processing. Additionally, in FIG. 5, the movement time in a horizontal axis may be replaced with a movement distance.

Furthermore, the present invention is not limited to the above-described embodiment and various modifications can be made without departing from the spirit of the present invention.

The invention claimed is:

1. An adaptive noise reduction method including an adaptive filter for obtaining a signal approximate to a periodic signal to be reduced from a reference input pulse signal synchronous with said periodic signal to be reduced within a main input signal, and composition means for subtracting an output signal of said adaptive filter from said main input signal, in which an output signal of said composition means is fed back to said adaptive filter and said adaptive filter performs adaptation processing so that noise power of the output signal of said composition means may be minimum, comprising the steps of:

providing a ring-shaped memory constituting said adaptive filter, providing a read-address generator for generating read addresses of the ring-shaped memory, and providing a write-address generator for generating write addresses thereof different from said read addresses, and wherein relative phase of address offset between said read address and said write address is made to be variable.

2. An adaptive noise reduction method according to claim 1, wherein the relative phase between said read address and said write address varies in accordance with a change in a period of said reference input pulse signal.

3. An adaptive noise reduction method according to claim 1, wherein said composition means subtracts the output signal of said adaptive filter from said main input signal through data interpolation means.

4. An adaptive noise reduction method according to claim 2, wherein said composition means subtracts the output signal of said adaptive filter from said main input signal through data interpolation means.

5. An adaptive noise reduction method according to claim 1, wherein the number of taps (the number of words) M of the ring-shaped memory constituting said adaptive filter has a relation of $$M \geq S \cdot TM$$

where S is a sampling frequency of said periodic signal to be reduced and TM is the maximum period that said reference input pulse signal can take.

6. An adaptive noise reduction method according to claim 1, wherein adaptive coefficients are read from and written into respective specified addresses of the read addresses or write addresses within a predetermined timing within one period.

7. An adaptive noise reduction apparatus including an adaptive filter for obtaining a signal approximate to a periodic signal to be reduced from a reference input pulse signal synchronous with said periodic signal to be reduced within a main input signal and composition means for subtracting an output signal of said adaptive filter from said main input signal, in which an output signal of said composition means is fed back to said adaptive filter and said adaptive filter performs adaptation processing so that noise power of the output signal of said composition means may be minimum, comprising:

a ring-shaped memory constituting said adaptive filter, a read-address generator for generating read addresses of said ring-shaped memory, and a write-address generator for generating write addresses thereof different from said read addresses, wherein relative phase of address offset between said read address and said write address is made to be variable.

8. An adaptive noise apparatus according to claim 7, wherein the relative phase between said read address and said write address varies in accordance with a change in a period of the reference input signal.

9. An adaptive noise reduction apparatus according to claim 7, wherein said composition means subtracts the output signal of said adaptive filter from said main input signal through data interpolation means.

10. An adaptive noise reduction apparatus according to claim 8, wherein said composition means subtracts the output signal of said adaptive filter from said main input signal through data interpolation means.

11. An adaptive noise reduction apparatus according to claim 7, wherein the number of taps (the number of words) M of the ring-shaped memory constituting the adaptive filter has a relation of $$M \geq S \cdot TM$$

where S is a sampling frequency of said periodic signal to be reduced and TM is the maximum period that said reference input pulse signal can take.

12. An adaptive noise reduction apparatus according to claim 7, wherein adaptive coefficients are read from and written into respective specified addresses of the read addresses or write addresses within a predetermined timing within one period.

13. An adaptive noise reduction apparatus according to claim 7, wherein the write-address generator moves data within the ring-shaped memory by one address at every one sampling clock.

14. An adaptive noise reduction apparatus according to claim 7, wherein the read-address position where the ring-shaped memory is variable relative to the write-address position.

15. An adaptive noise reduction apparatus according to claim 7, wherein the write-address position within the ring-shaped memory is variable relative to the read-address position.

16. An adaptive noise reduction apparatus according to claim 7, wherein the read-address position and write-address position within the ring-shaped memory vary.

17. An adaptive noise reduction apparatus according to claim 7, further comprising a counter receiving a sampling clock and a variable period pulse signal, the counter outputting a count value, and a timing generator generating predetermined timing pulse based upon the count value, the timing generator outputting the predetermined timing pulse to said read-address generator and said write-address generator.

* * * * *